(12) United States Patent
Croix

(10) Patent No.: US 6,327,557 B1
(45) Date of Patent: Dec. 4, 2001

(54) METHOD AND SYSTEM FOR CREATING ELECTRONIC CIRCUITRY

(75) Inventor: John Francis Croix, Round Rock, TX (US)

(73) Assignee: Silicon Metrics Corporation, Austin, TX (US)

( * ) Notice: Subject to any disclaimer, the term of this patent is extended or adjusted under 35 U.S.C. 154(b) by 0 days.

(21) Appl. No.: 09/090,457

(22) Filed: Jun. 4, 1998

(51) Int. Cl.⁷ .................................................. G06F 17/50
(52) U.S. Cl. ..................................... 703/14; 703/2; 716/1
(58) Field of Search ................... 395/500.02, 500.23, 395/500.35; 703/2, 13, 14; 716/1

(56) References Cited

U.S. PATENT DOCUMENTS 5,373,457 * 12/1994 George et al. .................. 395/500.23
5,774,382   6/1998 Tyler et al. ..................... 395/500.23

OTHER PUBLICATIONS

Croix et al, "A Fast and Accurate Technique to Optimize Characterization Tables for Logic Synthesis", IEEE Proceedings of the 34th Design Automation Conference, pp. 337–340, Jun. 1997.*

Menezes et al, "Simultaneous Gate and Interconnect Sizing for Circuit–Level Delay Optimization", Proceedings of the 32nd ACM/IEEE Design Automation Conference, pp. 690–695, Jun. 1995.*

John F. Croix, D.F. Wong, "A Fast and Accurate Technique to Optimize Characterization Tables for Logic Synthesis", Jun. 9, 1997.

* cited by examiner

Primary Examiner—Kevin J. Teska
Assistant Examiner—Samuel Broda
(74) Attorney, Agent, or Firm—Haynes and Boone, L.L.P.; Michael A. Davis, Jr.

(57) ABSTRACT

According to a first model of an operation of circuitry, a first set of estimates of the operation is generated in response to a set of conditions, including a first estimate of the operation in response to a first condition. According to a second model of the operation, a second set of estimates of the operation is generated in response to the first condition and the first set. In response to a comparison between the first estimate and the second set, a subset of the first set is selected. According to the second model, an estimate of the operation is generated in response to a second condition and the selected subset.

48 Claims, 5 Drawing Sheets

METHOD AND SYSTEM FOR CREATING ELECTRONIC CIRCUITRY

TECHNICAL FIELD

This patent application relates in general to electronic circuitry and in particular to a method and system for creating electronic circuitry.

BACKGROUND

Increasing density, complexity and speed of integrated electronic circuitry has resulted in a need for higher accuracy tools that support creation of designs for such circuitry, along with a need for higher speed tools to accommodate restricted schedules for creating such designs. One type of tool is a characterization tool for characterizing various cells of the circuitry. A cell is, for example, a component that performs a logical operation within the circuitry.

A characterization tool outputs characterization information that describes a cell's operations in response to various conditions. In response to such characterization information, a human designer may predict whether the circuitry will meet performance requirements. If such characterization information is inaccurate, the designer's prediction may likewise be inaccurate. If a design is manufactured based upon an inaccurate prediction, significant wasted time and monetary expense may be incurred.

SPICE is a generic name of a tool that includes a software program for modeling, in a relatively accurate manner, operations of cells in response to specified conditions. To achieve such accuracy, SPICE consumes a relatively high level of computational resources. Accordingly, execution of SPICE may result in substantial time delays.

In view of such delays, practical limits are imposed on the extent to which a human designer may rely upon SPICE for modeling a cell's operations in response to a wide variety of conditions. Rather than using SPICE for modeling a cell's operations in response to all likely conditions, a previous technique relies upon the designer to specify a number of representative conditions. According to such a technique, SPICE is executed for modeling the cell's operations in response only to the specified conditions.

A different tool, which is less computationally-intensive than SPICE, is executed for modeling the cell's operations in response to other conditions, thereby conserving computational resources and time. Nevertheless, unless the designer already knows the expected operations of the cell in response to various conditions, it is difficult and, in some cases, impractical for the designer to accurately determine which conditions should be specified as being the most representative. Accordingly, a cell's operations as estimated by the different tool may deviate by more than two percent (2%) from the cell's operation as estimated by SPICE. For conditions distant from the specified conditions, the deviations between SPICE estimates and the different tool's estimates may reach ten percent (10%) or more.

Accordingly, a need has arisen for a method and system for creating electronic circuitry, in which cells of the circuitry are characterized with higher accuracy relative to previous techniques. Also, a need has arisen for a method and system for creating electronic circuitry, in which cells of the circuitry are characterized with higher speed relative to previous techniques.

SUMMARY

According to a first model of an operation of circuitry, a first set of estimates of the operation is generated in response to a set of conditions, including a first estimate of the operation in response to a first condition. According to a second model of the operation, a second set of estimates of the operation is generated in response to the first condition and the first set. In response to a comparison between the first estimate and the second set, a subset of the first set is selected. According to the second model, an estimate of the operation is generated in response to a second condition and the selected subset.

It is a technical advantage that cells of the circuitry are characterized with higher accuracy relative to previous techniques.

It is another technical advantage that cells of the circuitry are characterized with higher speed relative to previous techniques.

BRIEF DESCRIPTION OF THE DRAWINGS

An illustrative embodiment and its advantages are better understood by referring to the following descriptions and accompanying drawing, in which.

DETAILED DESCRIPTION

Figure 1:
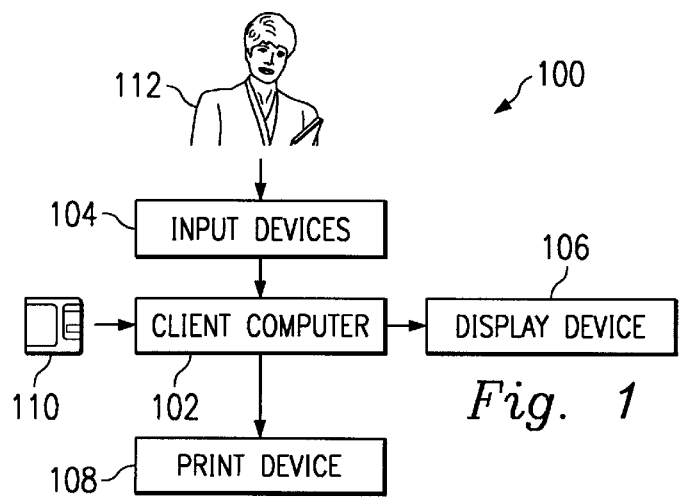
FIG. 1 is a block diagram of a system for processing information according to the illustrative embodiment.

An illustrative embodiment and its advantages are better understood by referring to FIGS. 1–14 of the drawing.

FIG. 1 is a block diagram of a system, indicated generally at 100, for processing information according to the illustrative embodiment. System 100 includes input devices 104, a display device 106, a print device 108, and a computer 102 for executing processes and performing operations (e.g. communicating information) in response thereto as discussed further hereinbelow. Computer 102 is connected to input devices 104, display device 106 and print device 108. Display device 106 is, for example, a conventional electronic cathode ray tube. Print device 108 is, for example, a conventional electronic printer or plotter.

Moreover, system 100 includes a computer-readable medium (or apparatus) 110, such as a floppy computer diskette or a computer hard drive. Computer-readable medium 1 10 and computer 102 are structurally and functionally interrelated with one another as described further hereinbelow. Computer-readable medium 110 stores (or encodes, or records, or embodies) functional descriptive material (e.g. including but not limited to computer programs (also referred to as computer applications) and information structures). Such functional descriptive material imparts functionality when encoded on computer-readable medium 110. Also, such functional descriptive material is structurally and functionally interrelated to computer-readable medium 110.

Within such functional descriptive material, information structures define structural and functional interrelationships between such information structures and computer-readable medium 110 (and other aspects of system 100). Such interrelationships permit the information structures' functionality to be realized. Also, within such functional descriptive material, computer programs define structural and functional interrelationships between such computer programs and computer-readable medium 110 (and other aspects of system 100). Such interrelationships permit the computer programs' functionality to be realized.

For example, computer 102 reads (or accesses, or copies) such functional descriptive material into a computer memory of computer 102, and computer 102 performs its operations (as described elsewhere herein) in response to such material which is stored in such computer memory. More particularly, computer 102 performs the operation of processing a computer application (that is stored, encoded, recorded or embodied on a computer-readable medium) for causing computer 102 to perform additional operations (as described elsewhere herein). Accordingly, such functional descriptive material exhibits a functional interrelationship with the way in which computer 102 executes its processes and performs its operations.

Further, the computer-readable medium is an apparatus from which the computer application is accessible by computer 102, and the computer application is processable by computer 102 for causing computer 102 to perform such additional operations. In addition to reading such functional descriptive material from computer-readable medium 110, computer 102 is capable of reading such functional descriptive material from (or through) a network (not shown in FIG. 1) which is also a computer-readable medium (or apparatus). Moreover, the computer memory is itself a computer-readable medium (or apparatus).

A human user 112 and computer 102 operate in association with one another. For example, in response to signals from computer 102, display device 106 displays visual images, and user 112 views such visual images. Also, in response to signals from computer 102, print device 108 prints visual images on paper, and user 112 views such visual images. Further, user 112 operates input devices 104 in order to output information to computer 102, and computer 102 receives such information from input devices 104.

Input devices 104 include, for example, a conventional electronic keyboard and a pointing device such as a conventional electronic "mouse", rollerball or light pen. User 112 operates the keyboard to output alphanumeric text information to computer 102, and computer 102 receives such alphanumeric text information from the keyboard. User 112 operates the pointing device to output cursor-control information to computer 102, and computer 102 receives such cursor-control information from the pointing device.

In the performance by system 100 of operations in accordance with the techniques (as discussed further hereinbelow) of the illustrative and alternative embodiments, display device 106 displays the visual images of FIGS. 2 through 14 in response to signals from computer 102, and print device 108 prints such visual images on paper in response to signals from computer 102.

Figure 2:
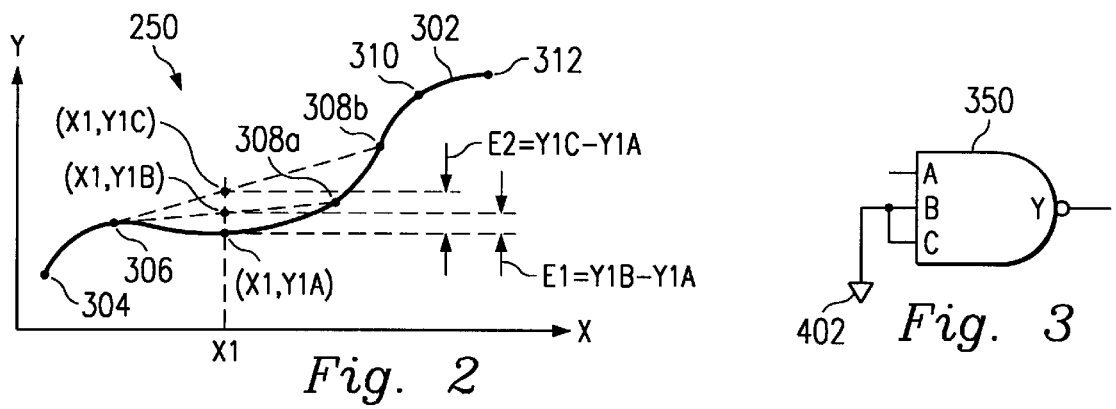
FIG. 2 is a graph of an example curve for illustrating a concept of the illustrative embodiment.

FIG. 2 is a graph, indicated generally at 250, of an example curve 302, for illustrating such a concept of the illustrative embodiment. It is important for system 100 to accurately perform cell characterization by modeling (or "describing") the cell's timing properties. Also, in designing integrated circuitry, a human designer specifies timing constraints that apply to the integrated circuitry. In response to such constraints and cell characterization information, automated computer software performs synthesis and timing verification operations to compile and validate a gate-level design ("netlist") of the cell. Accordingly, accurate cell characterization is important for meeting performance goals in deep-submicron designs.

For example, the operations of integrated circuitry cells may be characterized (or "represented" or "described" or "modeled") by mathematical equations ("characteristic equations") and other information (collectively referred to as "cell characterization information"). A characterization table includes multiple characteristic equations, which may be relatively simple fixed-form equations, in a manner analogous to the representation of complex functions by piecewise linear approximations of curves.

Alternatively, operations of such cells may be characterized by a single monolithic characteristic equation, both in terms of cell node-to-pin delay as well as the transition time of the signal at the output node. Nevertheless, such a single monolithic equation likely is relatively complex and often involves square and logarithmic terms for modeling inherent nonlinearities of the cell's propagation delay and output transition time. For example, the single monolithic characteristic equation may have nonlinear elements for accurately representing inherent nonlinearities in the operations of such cells. Such a characteristic equation may have product and log terms on the function variables and may include a few coefficients or many (e.g. 20 or more) coefficients.

Unlike a single monolithic characteristic equation, the characterization table of the illustrative embodiment is a multi-dimensional table for representing the cell's operation (s) in response to (or "as a function of") various types and ranges of conditions (e.g. input transition time, output capacitive loading ("output load"), temperature, voltage and process). Instead of using only a single set of coefficients to describe the cell's operation(s), the characterization table includes multiple sets of coefficients/equations to describe the cell's operation(s) across various ranges of conditions (e.g. various ranges of input transition time, output load, temperature, voltage and process). In such a manner, characterization tables form piecewise linear approximations of a complex curve. In a significant aspect of the illustrative embodiment, for accuracy within the characterization table, system 100 selects characterization points within regions of the complex curve that are most non-linear.

In the illustrative embodiment, system 100 executes software programs for simulating a cell's operation as a function of the conditions of input transition time and output load. In alternative embodiments, system 100 executes a software program for simulating a cell's operation as a function of at least three types of conditions. For example, in one alternative embodiment, system 100 executes a software program for simulating a cell's operation as a function of output load and at least two types of input transition time conditions, namely a clock signal's input transition time and an operand signal's input transition time.

As an example in the illustrative embodiment, for determining (or "measuring") the cell's operation(s) in response to a specified combination of input transition time and output load, system 100 executes a software program for simulating the cell's operation(s) ("circuit simulator") such as a software simulation program with integrated circuit emphasis ("SPICE"). Nevertheless, as a result of constraints on time and computer resources (e.g. computer memory and execution time), it is not practical for system 100 to measure the cell's operation(s) in response to all likely input transition times and output loads.

Instead, system 100 measures the cell's operation(s) in response to a preselected number of input transition times and output loads. A combination of a particular input transition time and a particular output load may be referred to as a characterization point. By prudently selecting the characterization points, system 100 creates an accurate characterization table while reducing the table's size.

In a significant aspect of the illustrative embodiment, system 100 performs dynamic programming and oversampling operations for creating such a characterization table, as discussed further hereinbelow. Advantageously, system 100 performs such operations by measuring and recording the cell's operation(s) in response to a subset of all likely input transition times and output loads. Such a goal presents significant challenges which are addressed by system 100.

For example, referring to FIG. 2, it is not practical for system 100 to measure y (e.g. an operation of a cell, such as the cell's output response (or "transition") time or the cell's propagation delay) in response to every possible value of x (e.g. a characteristic of the cell, such as the cell's output load or the cell's input transition time). Instead, in the example of FIG. 2, system 100 measures y in response to x only at five points, namely points 304, 306, 308a, 310 and 312. If y is unmeasured in response to a particular value of x, system 100 determines y in response to selected pair of measured points 304, 306, 308a, 310 and 312 that most closely bound the particular value of x. More particularly, system 100 interpolates between the selected pair in order to determine the unmeasured y in response to the particular value of x. By performing such interpolation, system 100 estimates the cell's operation.

In FIG. 2, y is unmeasured in response to x=X1. In this example, if system 100 had executed SPICE to measure y in response to X1, system 100 would have measured y=Y1A. Nevertheless, because y is unmeasured in response to x=X1, system 100 determines y in response to selected pair of measured points 304, 306, 308a, 310 and 312 that most closely bound X1. Accordingly, in the example of FIG. 2, system 100 selects the pair of measured points 306 and 308a, because such points (among the measured points) most closely bound X1. After selecting the pair of measured points 306 and 308a, system 100 interpolates between the selected pair in order to determine the unmeasured y in response to X1. By performing such interpolation, system 100 estimates y=Y1B. An error E1=(Y1B−Y1A) results from such interpolation, as indicated in FIG. 2.

It is important to carefully select the points which are to be measured and stored in a characterization table, because system 100 relies upon such measured points in order to accurately estimate the cell's operation(s) in response to particular unmeasured points. A random sampling of points (which are to be measured and stored) is not preferred. This is because a random sampling may result in relatively low accuracy when system 100 interpolates between the measured points.

For example, in FIG. 2, if measured point 308a is replaced by a measured point 308b, then system 100 selects the pair of measured points 306 and 308b as the measured points most closely bounding X1. After selecting the pair of measured points 306 and 308b, system 100 interpolates between the selected pair in order to determine the unmeasured y in response to X1. By performing such interpolation, system 100 estimates y=Y1C. An error E2=(Y1C−Y1A) results from such interpolation, as indicated in FIG. 2. Advantageously, E1 is smaller than E2, as a result of system 100 measuring point 308a instead of point 308b. This example helps explain the importance of system 100 carefully selecting the points that system 100 measures and stores in a characterization table.

Figure 3:
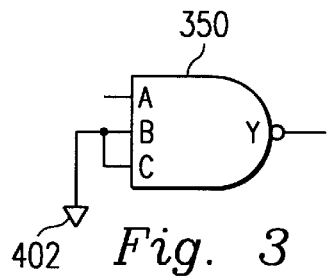
FIG. 3 is a schematic electrical circuit diagram of a 3-input NAND gate for illustrating a concept of the illustrative embodiment.

FIG. 3 is a schematic electrical circuit diagram of a 3-input NAND gate 350 for illustrating a concept of the illustrative embodiment. NAND gate 350 has input nodes A, B, and C. Also, NAND gate 350 has an output node Y.

Propagation delay ($t_d$) and output transition time ($t_{out}$) are a function of input transition time ($t_{in}$) and capacitive load ($C_l$). Accordingly, system 100 characterizes a cell by executing SPICE in response to information, such as information representing a voltage stimulus at an input node, a capacitive load ($C_l$) at the output node, and constant voltages (e.g. voltages $V_{CC}$ or $V_{SS}$) or transitioning (e.g. rising or falling) voltages at non-characterized nodes. Voltage $V_{CC}$ represents a true binary logic 1 state of a supply voltage node 402. Voltage $V_{SS}$ represents a false binary logic 0 state of a reference ("ground") voltage node (not shown in FIG. 3).

For example, in characterizing a delay between "characterized" nodes A and Y, system 100 executes SPICE in response to information representing a constant voltage $V_{CC}$ at non-characterized nodes B and C. In such a situation where A and Y are the characterized nodes, system 100 characterizes the operation of NAND gate 350 as an inverter having input node A and output node Y.

Figure 4:
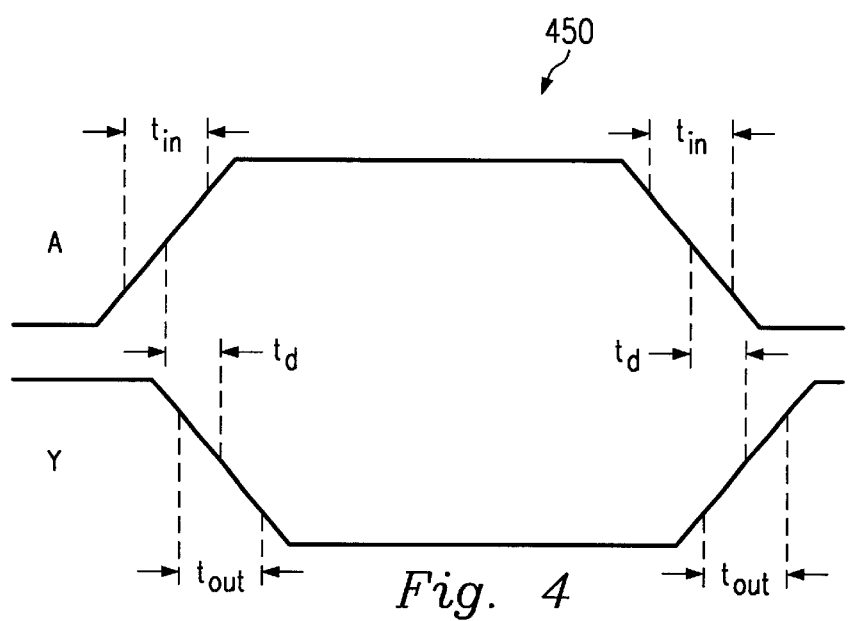
FIG. 4 is a graph of voltages at nodes of the NAND gate of FIG. 3, as a function of time.

FIG. 4 is a graph, indicated generally at 450, of voltages at nodes A and Y, as a function of time. For characterizing the delay between nodes A and Y, system 100 executes SPICE for determining output transition time ($t_{out}$) at node Y and propagation delay ($t_d$) between nodes A and Y, as shown in FIG. 4, in response to (a) an input voltage at node A having a preselected input transition time ($t_{in}$) and (b) a preselected capacitive load at node Y. System 100 performs such characterization in response to a variety of different values of input transition time at node A, plus a variety of different values of capacitive load at node Y.

In the illustrative embodiment, system 100 measures $t_d$ at the 50% point of $V_{CC}$. Also, in the illustrative embodiment, system 100 measures $t_{in}$ and $t_{out}$ along the substantially linear region of the voltage transition, normally between the 10% and 90% points (or, alternatively, between the 20% and 80% points) of $V_{CC}$.

System 100 determines and stores such characterization information for various types of cells. For each type of cell, system 100 performs such characterization in response to information representing a voltage stimulus at an input node, a capacitive load at the output node, and constant voltages at non-characterized nodes, such that system 100 determines variable voltages at characterized nodes. System 100 performs such characterization for various combinations of input nodes and output nodes. More particularly, while system 100 characterizes a particular input node in combination with a particular output node, other input nodes and other output nodes are non-characterized (e.g. system 100 represents such other input nodes as having constant voltages).

Further, system 100 performs (and stores) such characterization multiple times in response to a variety of different values of input transition time at the characterized input node, plus a variety of different values of capacitive load at the characterized output node (which is being characterized in combination with the characterized input node). This is advantageous relative to previous techniques that characterize only a small number (e.g. 4) of values for such capacitive load $C_l$, each in combination with only a single respective input transition time. Moreover, according to some previous techniques, for each value of $C_l$, the single respective input transition time is the average of a few (e.g. 4) input transition times, each of which is measured in response to a different value of capacitive load $C_{rise/fall}$ at the characterized input node.

For each characterized input node, system 100 performs the characterization (a) first, in response to information representing a rising voltage stimulus at the characterized input node, and (b) second, in response to information representing a falling voltage stimulus at the characterized input node. In that manner, for each characterized input node, system 100 characterizes $t_{in}$ in two forms, namely (a) $t_{in}=t_{LHi}$ for a low-to-high transition and (b) $t_{in}=t_{HLi}$ for a high-to-low transition. Likewise, in that manner, for each characterized output node, system 100 characterizes $t_{out}$ in two forms, namely (a) $t_{out}=t_{LH_o}$ for a low-to-high transition and (b) $t_{out}=t_{HL_o}$ for a high-to-low transition.

Generally, cells are either unate or binate. For a binate cell, such as an exclusive OR ("XOR") gate, polarity (i.e. either $t_{LH_o}$ or $t_{HL_o}$) of $t_{out}$ is a function not only of polarity (i.e. either $t_{LHi}$ or $t_{HLi}$) of $t_{in}$, but also of respective conditions at one or more non-characterized nodes, such as (a) whether one or more non-characterized nodes is respectively biased to a true binary logic 1 state or instead to a false binary logic 0 state and/or (b) whether one or more non-characterized nodes receives a respective signal having a positive (e.g. rising voltage) transition or instead a negative (e.g. falling voltage) transition. Accordingly, for each characterized binate cell, system 100 performs such characterization in response to information representing various sets of conditions at non-characterized nodes, so that all states of the cell are characterized.

For example, in characterizing an XOR gate having input nodes A and B and an output node Y, system 100 performs such characterization for characterized nodes A and Y (a) first, in response to a constant voltage $V_{CC}$ at node B, and (b) second, in response to a constant voltage $V_{SS}$ at node B. When node B has a constant voltage $V_{SS}$, the XOR gate operates as a buffer. In contrast, when node B has a constant voltage $V_{CC}$, the XOR gate operates as an inverter.

In the process of designing and creating integrated electronic circuitry, human designers and computers may create a library of logic functionality, rather than designing each logic gate individually. From the library, human designers and computers may select components for implementing logical functionality within the physical integrated electronic circuitry. Such a library is sometimes referred to as a standard cell library, and it forms a basic building block for design and creation of the circuitry. System 100 characterizes the propagation delay and output transition time of standard cells in such a library.

Cell libraries also include cell timing characteristics for performing static and dynamic timing analysis. Within such a library, the number of cells varies, as does the type of cell functionality. Such a library may include, for example, as many as 40 to 50 different types of boolean functions. Each boolean function may have multiple sizes or "drive strengths".

For example, a library may include 6 to 8 different types of inverters. Relative to a large inverter, a small inverter has a smaller input node capacitance, intrinsic delay, and area. Relative to a small inverter, a large inverter can drive a greater number of capacitive loads or a longer interconnect route. Preferably, circuitry is designed and created to minimize area and/or timing while satisfying the imposed design constraints. Thus, a library preferably includes various components to enable selection among a wide range of drive strengths and functionality.

Cells may be named according to their functionality and drive strength. For example, a library may contain inverters named INV_A, INV_B, INV_C, INV_D, INV_E, and INV_F. Drive strengths are meaningful indicators and may be shared across different functions. For example, all cells with a drive strength of D may be capable of driving a substantially equal amount of capacitive load.

In the illustrative embodiment, system 100 characterizes a cell within a library by executing SPICE for determining propagation delays and output transition times of the characterized cell. In response to these determined times and delays, system 100 further determines values of coefficients in a characteristic equation (or in multiple characteristic equations within a characterization table), according to a generalized curve-fitting technique such as least-squares. Characterization models of the illustrative embodiment include a driving cell (e.g. an inverter or buffer), in addition to the characterized cell.

Although a driving cell may be modeled (or "represented") as a form of ideal voltage supply with a current-limiting resistor, input transition times are not fully linear. This is because characterized cells would not usually receive fully linear voltages at their input nodes. Thus, such an ideal voltage supply is not a preferred model.

Figure 5:
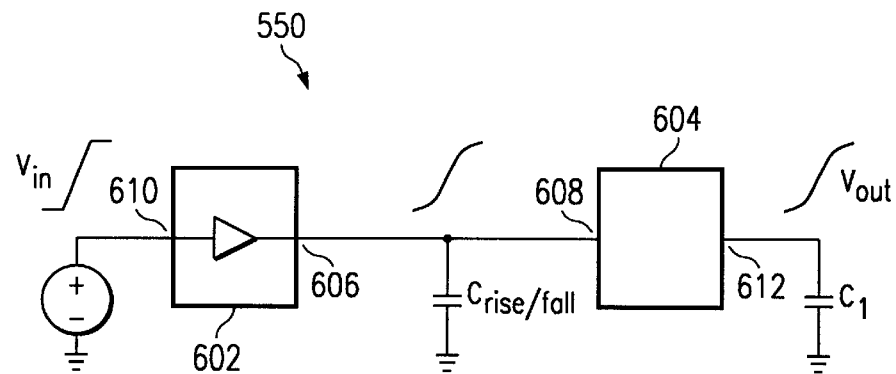
FIG. 5 is a schematic electrical circuit diagram of a driving cell and a characterized cell.

FIG. 5 is a schematic electrical circuit diagram, indicated generally at 550, of a driving cell 602 and a characterized cell 604. In FIG. 5, an output node 606 of driving cell 602 is coupled to an input node 608 of characterized cell 604. In response to a voltage $V_{in}$ at an input node 610 of driving cell 602, along with a varying capacitive load $C_{rise/fall}$ at output node 606, voltages having transition times of varying length are generated at output node 606.

In response to $V_{in}$ transitioning from a first voltage (representing a first logic state) to a second voltage (representing a second logic state) in a substantially linear manner, driving cell 602 outputs (or "generates") a voltage signal at output node 606. A particular transition time of such a voltage signal (at output node 606) is achieved by selecting a suitable value of $C_{rise/fall}$. Because output node 606 is coupled to input node 608, voltages generated at output node 606 are likewise generated at input node 608. Moreover, in the illustrative embodiment, system 100 characterizes a cell in response to a variety of different values of $C_{rise/fall}$ and $C_l$ (i.e. capacitive load at an output node 612 of characterized cell 604.

Figure 6:
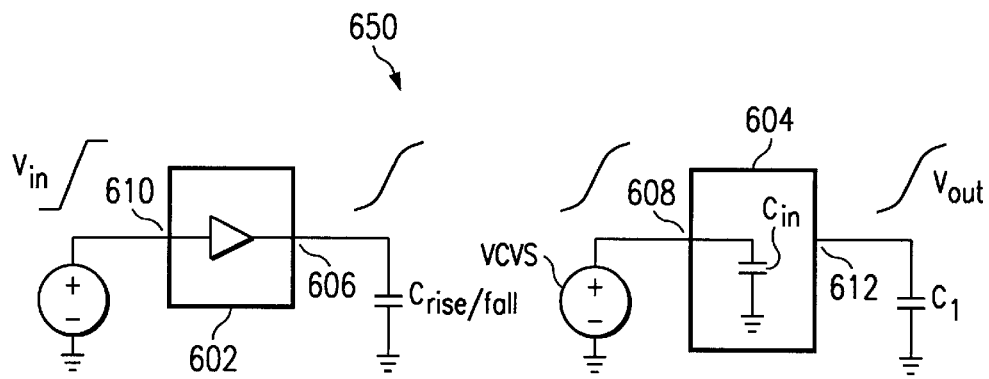
FIG. 6 is a schematic electrical circuit diagram of a modified version of the circuitry of FIG. 5.

FIG. 6 is a schematic electrical circuit diagram, indicated generally at 650, of a modified version of circuitry 550. As indicated in FIG. 6, input node 608 has an intrinsic capacitance $C_{in}$. Accordingly, a shortcoming of the model of FIG. 5 is that a value of $C_{in}$ varies according to the transition time of the voltage generated at output node 606. Thus, with the model of FIG. 5, it is difficult to select a suitable value of $C_{rise/fall}$ for achieving a particular transition time.

Figure 7:
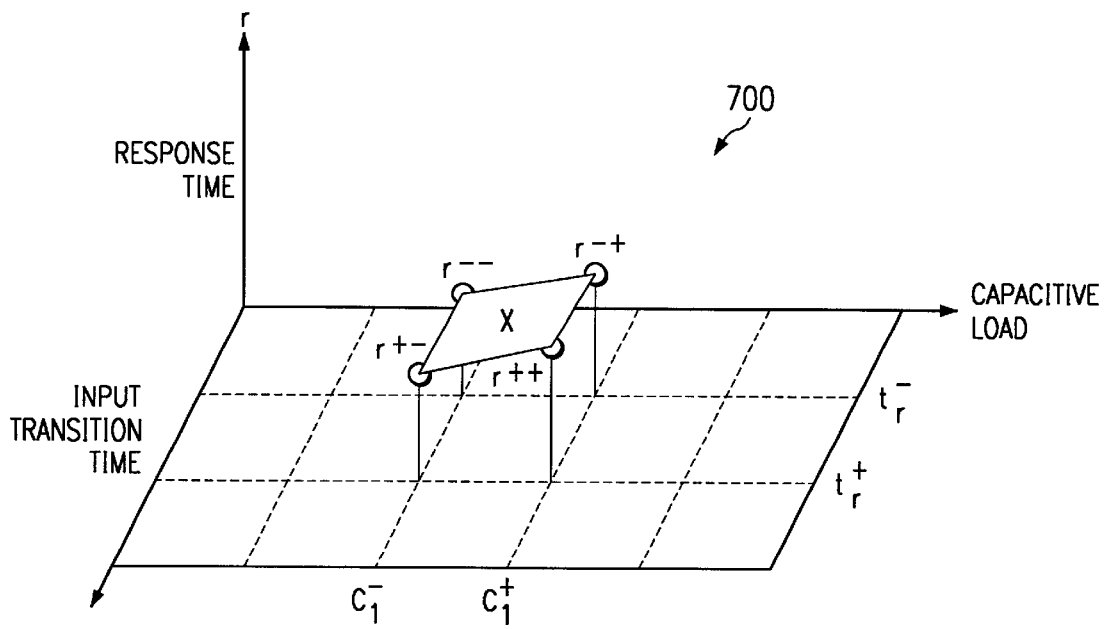
FIG. 7 is first graph of response time r as a function of $C_l$, and $t_r$.

By comparison, in the model of FIG. 6, driving cell 602 is electrically isolated from characterized cell 604. Circuitry 650 includes a voltage-controlled-voltage-source ("VCVS") for generating a voltage signal at input node 608 which is substantially equal to the voltage signal generated at output node 606. With the model of FIG. 6, a suitable value of $C_{rise/fall}$ is more readily determined to achieve a particular transition time of the voltage signals at nodes 606 and 608. FIG. 7 is graph, indicated generally at 700, of response time r as a function of $C_l$ and $t_r$ where $r=t_{out}$ or $t_d$, and where $t_r=t_{in}$ (i.e. either $t_{LHi}$ or $t_{HLi}$). FIG. 7 shows four characterization points, namely $(t_r^+, C_l^+)$, $(t_r^+, C_l^-)$, $(t_r^-, C_l^+)$, $(t_r^-, C_l^-)$ most closely adjacent (or "proximate") to a point X. In this example, system 100 has executed SPICE for a particular "to-be-characterized" cell to determine respective values of r in response to the respective values of $t_r$ and C, which define characterization points $(t_r^+, C_l^+)$, $(t_r^+, C_l^-)$, $(t_r^-, C_l^-)$, $(t_r^-, C_l^-)$, but system 100 has not executed SPICE to determine a value of r in response to the particular values of $t_r$ and $C_l$, which define point X. System 100 stores such determined values of r (associated with characterization points $(t_r^+, C_l^+)$, $(t_r^+, C_l^-)$, $(t_r^{-}, C_l^-)$ in a characterization table.

Nevertheless, it may be helpful for system 100 to accurately determine an estimated value of r at point X. For example, system 100 may execute a static timing analysis software package in response to such estimate, in order to analyze timing interrelationships between multiple characterized cells that are coupled to one another within integrated electronic circuitry. In performing such analysis, the static timing analysis software package may incorporate various predetermined assumptions regarding the operations of such integrated electronic circuitry. Before executing the static timing analysis software package in response to the estimated value of r (at point X), accuracy is enhanced by determining such estimated value of r (at point X) in a manner consistent with such predetermined assumptions.

For example, one such predetermined assumption is the relationship between r, $t_r$ and $C_l$. Such relationship may be expressed in the form of a characteristic equation. Thus, accuracy is enhanced by estimating the value of r at point X in a manner consistent with such characteristic equation.

One static timing analysis software package is commercially available from Synopsys, having an address at 700 East Middlefield Rd., Mountain View, Calif. 94043, a telephone number (650) 962-5000, and a global computer network address of www.synopsys.com. Such a package uses the following characteristic equation to express the relationship between r, $t_r$ and $C_1$.

$$r=f(t_r, C_l)=A*t_r+B*C_l+C*t_r*C_l+D \qquad (1)$$

Accordingly, system 100 is able to determine r at point X in a manner consistent with such characteristic equation, and without executing SPICE for point X. More particularly, system 100 identifies the aforementioned four characterization points that are most closely adjacent to point X, such that:

$$C_l^- \le C_l \le C_l^+$$
$$t_r^- \le t_r \le t_r^+$$

These four characterization points identify four entries in the characterization table, namely:

$$r^{--} = \text{table }(t_r^-, C_l^-)$$
$$r^{+-} = \text{table }(t_r^+, C_l^-)$$
$$r^{-+} = \text{table }(t_r^-, C_l^+)$$
$$r^{++} = \text{table }(t_r^+, C_l^+)$$

Then, system 100 determines real numbers A, B, C and D (i.e. constant elements) of the characteristic equation in response to the identified four characterization points (i.e. system 100 uses the four characterization points to solve for the four unknowns of such characteristic equation), such that:

$$\begin{bmatrix} t_r^- & C_l^- & t_r^-*C_l^- & 1 \\ t_r^+ & C_l^- & t_r^+*C_l^- & 1 \\ t_r^- & C_l^+ & t_r^-*C_l^+ & 1 \\ t_r^+ & C_l^+ & t_r^+*C_l^+ & 1 \end{bmatrix} \begin{bmatrix} A \\ B \\ C \\ D \end{bmatrix} = \begin{bmatrix} r^{--} \\ r^{+-} \\ r^{-+} \\ r^{++} \end{bmatrix}$$

After determining A, B, C and D, system 100 determines a value of r (in response to the particular values of $t_r$ and $C_1$ which define point X) in accordance with such characteristic equation and such determined values of A, B, C and D.

As explained further hereinabove in connection with FIG. 2, it is important to carefully select the points to be characterized by system 100. This is because some characterization points (in comparison to other possible characterization points) will enable system 100 to more accurately determine an estimated value of r (in response to the particular values of $t_r$ and $C_l$ which define point X). By more accurately determining this estimated value of r, system 100 more accurately executes the static timing analysis software package in response to such estimate, so that system 100 more accurately analyzes timing interrelationships between multiple characterized cells that are coupled to one another within integrated electronic circuity.

Figure 8:
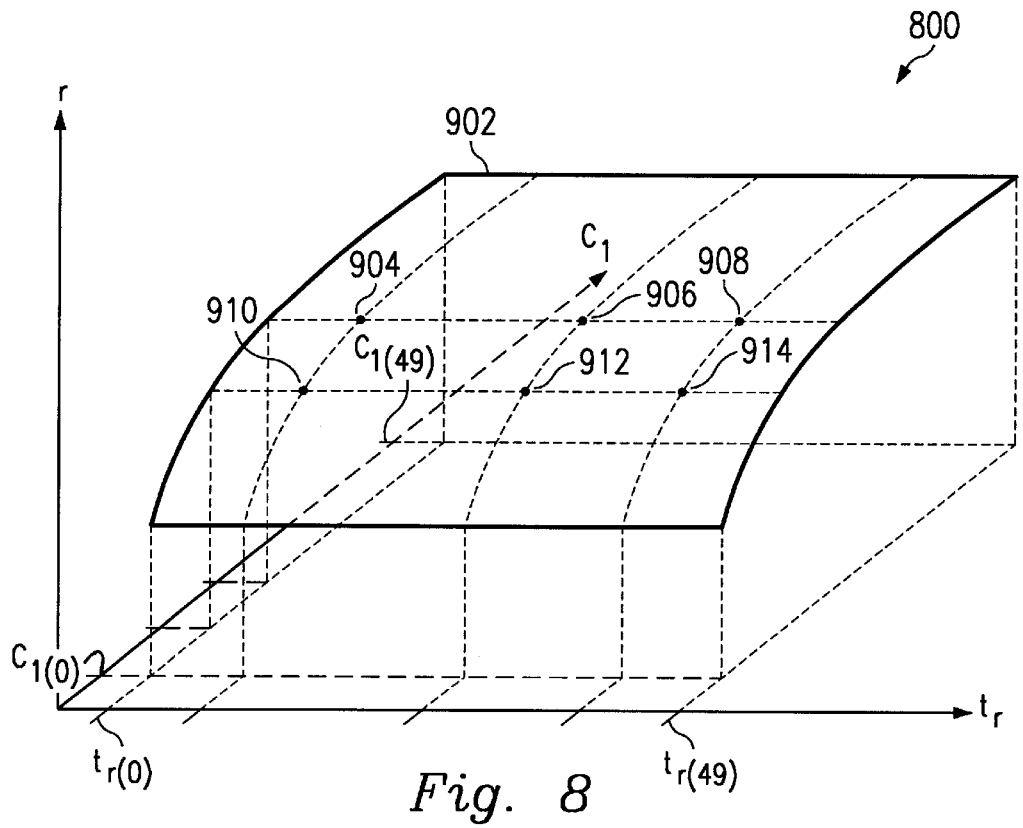
FIG. 8 is second graph of response time r as a function of $C_l$, and $t_r$.

FIG. 8 is a graph, indicated generally at 800, of response time r as a function of $C_l$ and $t_r$. In the following example, system 100 selects characterization points from among 2500 candidate points along surface 902. Nevertheless, the manner in which the number of candidate points is adjustable will be readily apparent. By selecting characterization points from among a number of candidate points, system 100 performs oversampling and pruning operations as discussed further hereinbelow.

Accordingly, in the example of FIG. 8, four points $(t_{r(0)}, C_{l(0)})$, $(t_{r(0)}, C_{l(49)})$, $(t_{r(49)}, C_{l(0)})$ and $(t_{r(49)}, C_{l(49)})$ define the corner points of a surface 902. Surface 902 represents $r=f(C_l, t_r)$, where $f(C_l, t_r)$ is a characteristic equation such as equation (1) discussed further hereinabove in connection with FIG. 7 (or, alternatively, where $f(C_l, t_r)$ is a characterization table). In a significant aspect of the illustrative embodiment, system 100 determines a respective combination of $t_{r(0)}$, $C_{l(0)}$, $t_{r(49)}$ and $C_{l(49)}$ separately (e.g. independently, individually) for each characterization table of each characterized cell.

For example, for a unate cell, system 100 creates a respective set of characterization tables for a particular combination of an input node and an output node. Each set of characterization tables includes (a) a first table for output transition time ($t_{out}$) at the characterized output node in response to a variety of different values of $C_l$ and $t_{in}=t_{LHi}$, (b) a second table for output transition time ($t_{out}$) at the characterized output node in response to a variety of different values of $C_l$ and $t_{in}=t_{HLi}$, (c) a third table for propagation delay ($t_d$) between the characterized input and output nodes in response to a variety of different values of $C_l$ and $t_{in}=t_{LHi}$, and (d) a fourth table for propagation delay ($t_d$) between the characterized input and output nodes in response to a variety of different values of $C_l$ and $t_{in}=t_{HLi}$. For a binate cell, system 100 creates additional characterization tables in accordance with the discussion further hereinabove in connection with FIG. 4.

In the illustrative embodiment, the value of $C_{l(0)}$ is either (a) specified by human user 112 of system 100 or (b) initialized (or "established") at zero by system 100. Also, system 100 determines the value of $t_{r(49)}$ in response to a maximum acceptable output transition time for the characterized output node (as specified by human user 112). Further, system 100 executes SPICE for determining the value of $C_{l(49)}$ as a function of $t_{r(49)}$. Moreover, system 100 establishes the value of $t_{r(0)}$ as being equal to the shortest transition time (of a voltage output by a driving cell, such as the voltage output at node 606 by cell 602 of FIG. 6) achieved by driving cells of the particular cell library being characterized.

As mentioned hereinabove, in this example, system 100 selects characterization points from among 2500 (i.e. $N^2$, where $N=50$) candidate points along surface 902. Accordingly, system 100 identifies such candidate points as $(t_{r(A)}, C_{l(B)})$, where A is an integer number ranging between 0 and $N-1$, and B is an integer number ranging between 0 and $N-1$. (Notably, integers A and B are distinct from real numbers A and B of equation (1) discussed further hereinabove in connection with FIG. 7.) In the illustrative embodiment, the values of $t_{r(A)}$ are $t_{r(0)} * 10^{(A*F)}$, and the values of $C_{l(B)}$ are $C_{l(0)} * 10^{(A*G)}$, where:

$$F = |\log(t_{r(49)}) - \log(t_{r(0)})| \div (N-1)$$

$$G = |\log(C_{l(49)}) - \log(C_{l(0)})| \div (N-1)$$

Advantageously, such logarithmic terms help ensure that more candidate points are located at lower values of $t_r$ and $C_l$, where surface 902 is more likely to be curved.

In an alternative embodiment for distributing candidate points more evenly along surface 902, the values of $t_{r(A)}$ are $t_{r(0)}+(A*J)$, and the values of $C_{l(B)}$ are $C_{l(0)}+(A*K)$, where:

$$J = |t_{r(49)} - t_{r(0)}| \div (N-1)$$

$$K = |C_{l(49)} - C_{l(0)}| \div (N-1)$$

In the illustrative embodiment, the number of selected characterization points is a number $C=V*W$, where V is an integer number of $t_{r(A)}$ coordinates and W is an integer number of $C_{l(B)}$ coordinates. For example, as shown in FIG. 8, system 100 may select six characterization points 904, 906, 908, 910, 912 and 914 (from among the candidate points) by selecting $V=3 t_{r(A)}$ coordinates and $W=2 C_{l(B)}$ coordinates. Similarly, as another example, system 100 may select nine characterization points (from among the candidate points) by selecting $V=3$ tr(A) coordinates and $W=3 C_{l(B)}$ coordinates.

Figure 9:
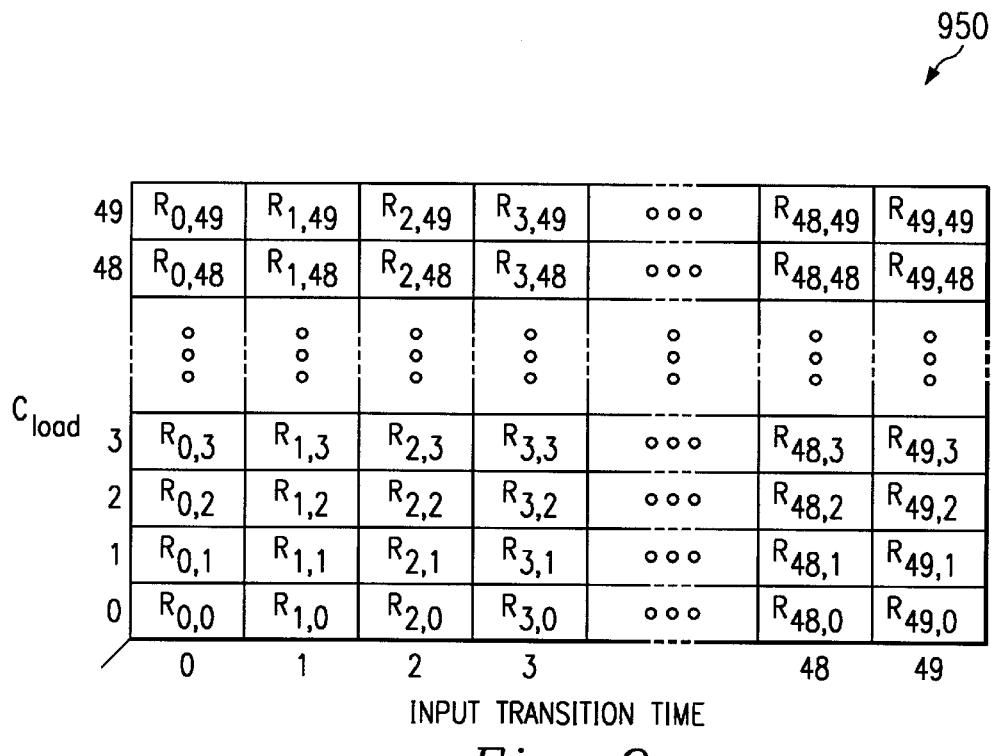
FIG. 9 is a table of information entries of the illustrative embodiment.

FIG. 9 is a table, indicated generally at 950, of $N^2$ information entries $R_{A,B}$ associated with the $N^2$ candidate points $(t_{r(A)}, C_{l(B)})$, respectively. Finite memory and runtime limits of system 100 impose practical constraints on the size of tables such as table 950. Relative to larger tables, smaller tables consume fewer resources of system 100, but smaller tables may result in larger errors.

Preferably, in accordance with the discussion hereinabove in connection with FIG. 7, system 100 selects characterization points (i.e. a subset of candidate points $(t_{r(A)}, C_{l(B)})$) in the manner discussed further hereinbelow, so that system 100 more accurately determines an estimated value of r (in response to particular values of $t_r$ and $C_l$ which define a point X). By more accurately determining this estimated value of r, system 100 more accurately executes a static timing analysis software package in response to such estimate, so that system 100 more accurately analyzes timing interrelationships between multiple characterized cells that are coupled to one another within integrated electronic circuitry.

For each identified candidate point $(t_{r(A)}, C_{l(B)})$, system 100 executes SPICE for determining a respective value of r ($r_{SPICE}$) in response to the particular values of $t_r$ and $C_l$ which collectively define such candidate point. Accordingly, system 100 generates (with, and according to, the computer-implemented SPICE model of the characterized cell's operation(s)) a first set of estimates of the characterized cell's operation(s) in response to a set of conditions, respectively. The first set of estimates is formed by the respective values of r ($r_{SPICE}$), and the set of conditions is formed by respective combinations of values of $t_r$ and $C_l$ which collectively define the candidate points. For example, (a) a first condition (of the set of conditions) is a particular value of $t_r$ in combination with a particular value of $C_l$, which collectively define a particular candidate point, and (b) the first condition's respectively associated first estimate (which is one estimate of the first set of estimates) is a particular value of r ($r_{SPICE}$) that system 100 determines by executing SPICE in response to the first condition.

Then, system 100 determines (for each candidate point) the errors resulting from selection of such candidate point, and system 100 compares such errors to one another. Potentially, any candidate point may form the lower left corner (i.e. lowest values of A and B) of a region that includes a subset of other candidate points. Accordingly, in a significant aspect of the illustrative embodiment, for each candidate point $(t_{r(A=X)}, C_{l(B=Y)})$, system 100 determines the errors resulting from selection of such candidate point.

More particularly, in the illustrative embodiment, system 100 determines such errors (resulting from selection of candidate point $(t_{r(A=X)}, C_{l(B=Y)})$) by performing the following steps. First, system 100 determines real numbers A, B, C and D of the characteristic equation (e.g. equation (1)) in response to candidate points $(t_{r(A=X)}, C_{l(B=Y)})$, $(t_{r(A=X)}, C_{l(B=P=(N-1))})$, $(t_{r(A=M=(N-1))}, C_{l(B=Y)})$ and $(t_{r(A=M=(N-1))}, C_{l(B=P=(N-1))})$, as discussed further hereinabove in connection with FIG. 7. (Notably, as mentioned hereinabove, real numbers A and B of equation (1) are distinct from integers A and B of the candidate points.)

After determining real numbers A, B, C and D of the characteristic equation, system 100:

(a) for each candidate point $(t_{r(X \leq A \leq M)}, C_{l(Y \leq B \leq P)})$, determines a respective value of r ($r_{interpolate}$) in response to the particular values of $t_r$ and $C_l$ which collectively define such candidate point, in accordance with such characteristic equation and such determined values of A, B, C and D;

(b) for each candidate point $(t_{r(X \leq A \leq M)}, C_{l(Y \leq B \leq P)})$, determines a respective absolute difference between such candidate point's respective value of $r_{interpolate}$ and such candidate point's respective value of $r_{SPICE}$;

(c) determines a sum of all such absolute differences for all candidate points ($t_{r(X<A<M)}$, $C_{l(Y<B<P)}$); and (d) stores such sum at entry $R_{A=XB=Y}$ (of table 950) associated with candidate point ($t_{r(A=X)}$, $C_{l(B=Y)}$), such sum being the error resulting from selection of such candidate point "in combination with point ($t_{r(A=M)}$, $C_{l(B=P)}$)".

The above-described steps have been described for a situation where (a) candidate point ($t_{r(A=X)}$, $C_{l(B=Y)}$) forms the lower left corner (i.e. lowest values of A and B) of a region that includes a subset of other candidate points and (b) point ($t_{r(A=M=(N-1))}$, $C_{l(B=P=(N-1))}$) forms the upper right corner (i.e. highest values of A and B) of such region.

System 100 repeats the above-described steps once per each other candidate point ($t_{r(X<A<(N-1))}$, $C_{l(Y<B<(N-1))}$) forming the upper right corner of such region, so that (in the illustrative embodiment) system 100 repeats the above-described steps a total of $\{-(N-X)-(N-Y)\}$ times for a particular combination of X and Y.

Moreover, system 100 repeats the above-described steps once per each other candidate point ($t_{r(0<X<(N-1))}$, $C_{l(0<Y<(N-1))}$) forming the lower left corner of such region, so that (in the illustrative embodiment) system 100 repeats the above-described steps (including steps described in the immediately preceding paragraph) a total of ($N^2-2*N$) times.

Thus, aggregately, in the illustrative embodiment, system 100 performs the above-described steps a total of Z times, including the original performance and the repeated performances, where:

$$Z = [N^2 - (2*N) + 1] * \sum_{\substack{X=0 \\ Y=0}}^{\substack{N-2 \\ N-2}} \{[(N-X)*(N-Y)] - (N-X) - (N-Y) + 1\}.$$

Accordingly, for each condition (e.g. the first condition), system 100 generates (with, and according to, the computer-implemented characteristic equation model of the characterized cell's operation(s)) a respectively associated second set of estimates of the characterized cell's operation(s) in response to such condition, and further in response to various subsets of the first set of estimates (i.e. system 100 determines real numbers A, B, C and D of the characteristic equation in response to a subset of the first set of estimates). For example, in the illustrative embodiment, each subset includes (and is respectively associated with) four values of $r_{SPICE}$ that are respectively associated with four candidate points which form four corners of a particular region. Each condition's respectively associated second set of estimates is formed by the values of r ($r_{interpolate}$) that system 100 determines in response to such condition. Such values are respectively associated with different regions that have different corners formed by different candidate points; thus, such values and such regions are respectively associated with different sets of values for real numbers A, B, C and D of the characteristic equation.

As discussed further hereinbelow in connection with FIGS. 10 and 11, in response to a comparison between a condition's (e.g. the first condition's) (a) respectively associated first estimate and (b) respectively associated second set of estimates, system 100 selects a subset of the first set of estimates. Also, system 100 executes a static timing analysis software package in which system 100 determines real numbers A, B, C and D of the characteristic equation in response to the selected subset. Moreover, in executing the static timing analysis software package, system 100 generates (with, and according to, the computer-implemented characteristic equation model of the characterized cell's operation(s))estimates of the characterized cell's operation(s) in response to (a) respectively associated conditions (e.g. each condition being a particular value of $t_r$ in combination with a particular value of $C_l$) and (b) such determined real numbers A, B, C and D. Advantageously, in executing the static timing analysis software package, system 100 generates such estimates without regard to (and independent of, and irrespective of) whether the conditions define previously identified candidate points.

Figure 10:
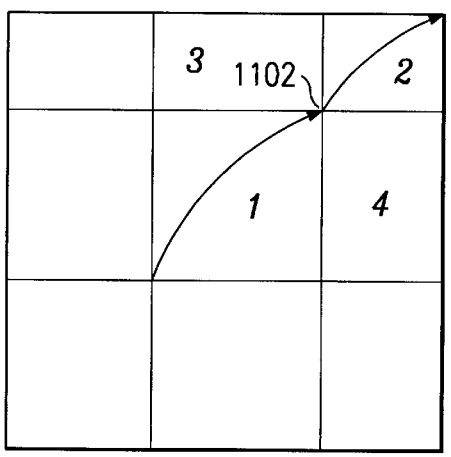
FIG. 10 is an illustration of a first multi-stage version of the technique of the illustrative embodiment.

FIG. 10 is an illustration of a first multi-stage version of the technique discussed hereinabove in connection with FIG. 9. In the multi-stage versions, system 100 determines (according to a multi-stage approach) the errors resulting from selection of candidate point ($t_{r(A=X)}$, $C_{l(B=Y)}$), for a situation where (a) candidate point ($t_{r(A=X)}$, $C_{l(B=Y)}$) forms the lower left corner of a region that includes a subset of other candidate points and (b) point ($t_{r(A=M=(N-1))}$, $C_{l(B=P=(N-1))}$) forms the upper right corner of such region. Under the multi-stage approach, system 100 determines a multi-stage error by adding the errors of all "subregions" included within such region.

For example, as indicated in FIG. 10, for an entry 1102 being $R_{S,W}$ associated with point ($t_{r(S)}$, $C_{l(W)}$), where X<S<(N-1), and where Y<W<(N-1), system 100 determines a 2-stage error by adding:

(a) the error ("subregion 1 error") stored at entry $R_{X,Y}$ for the situation where point ($t_{r(S)}$, $C_{l(W)}$) forms the upper right corner of subregion 1 of FIG. 10 (i.e. the error resulting from selection of candidate point ($t_{r(X)}$, $C_{l(Y)}$)) in combination with point ($t_{r(S)}$, $C_{l(W)}$));

(b) the error ("subregion 2 error") stored at entry $R_{S,W}$ for the situation where point ($t_{r(N-1)}$, $C_{l(N-1)}$) forms the upper right corner of subregion 2 of FIG. 10;

(c) the error ("subregion 3 error") stored at entry $R_{X,W}$ for the situation where point ($t_{r(S)}$, $C_{l(N-1)}$) forms the upper right corner of subregion 3 of FIG. 10; and (d) the error ("subregion 4 error") stored at entry $R_{S,Y}$ for the situation where point ($t_{r(N-1)}$, $C_{l(W)}$) forms the upper right corner of subregion 4 of FIG. 10.

With regard to the error determined as a result of such addition, such error is the 2-stage error resulting from selection of candidate point ($t_{r(X)}$, $C_{l(Y)}$)) "in combination with point ($t_{r(S)}$, $C_{l(W)}$)) as an intermediate point to point ($t_{r(N-1)}$, $C_{l(N-1)}$)".

For each candidate point ($t_{r(X)}$, $C_{l(W)}$), system 100 determines such a 2-stage error for all integer values of S and W, where X<S<(N-1), and where Y<W<(N-1). Moreover, for each candidate point ($t_{r(X)}$, $C_{l(Y)}$), system 100 determines the intermediate point ($t_{r(S)}$, $C_{l(W)}$) for which the 2-stage error is smallest. Accordingly, at entry $R_{X,Y}$ (of table 950) associated with candidate point ($t_{r(X)}$, $C_{l(Y)}$), system 100 stores an indication of the point ($t_{r(S)}$, $C_{l(W)}$) for which the 2-stage error is smallest, along with the value of that smallest 2-stage error.

Figure 11:
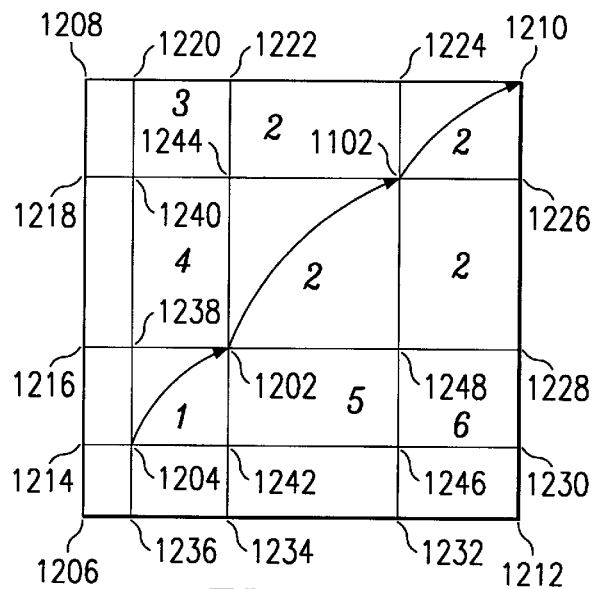
FIG. 11 is an illustration of a second multi-stage version of the technique of the illustrative embodiment.

FIG. 11 is an illustration of a second multi-stage version of the technique discussed hereinabove in connection with FIG. 10. In FIG. 11, entry 1202 is $R_{X,Y}$ associated with point ($t_{r(X)}$, $C_{l(Y)}$) of FIG. 10. For determining a 3-stage error resulting from selection of a candidate point ($t_{r(A)}$, $C_{l(B)}$), where A<X and/or B<Y, system 100 adds the smallest 2-stage error of FIG. 10 (i.e. the 2-stage error stored by system 100 at entry $R_{X,Y}$) to (a) a "subregion 1 error" of FIG. 11, (b) a "subregion 3 error" of FIG. 11, (c) a "subregion 4 error" of FIG. 11, (d) a "subregion 5 error" of FIG. 11, and (d) a "subregion 6 error" of FIG. 11. System 100 performs such addition of the subregion 1, 3, 4, 5 and 6 errors of FIG.

11 in a manner analogous to the manner in which system 100 performs addition of the regions 1, 2, 3 and 4 errors of FIG. 10 as discussed further hereinabove.

For each candidate point $(t_{r(X)}, C_{I(Y)})$, system 100 determines such a 3-stage error for all possible combinations of 2 intermediate points between point $(t_{r(X)}, C_{I(Y)})$ and point $(t_{r(N-1)}, C_{I(N-1)})$. Moreover, for each candidate point $(t_{r(X)}, C_{I(Y)})$, system 100 determines the 2 intermediate points for which the 3-stage error is smallest. Accordingly, at entry $R_{X,Y}$ (of table 950) associated with candidate point $(t_{r(X)}, C_{I(Y)})$, system 100 stores an indication of the 2 intermediate points for which the 3-stage error is smallest, along with the value of that smallest 3-stage error.

Likewise, where $(c+2)^2$ is a number of characterization points to be selected by system 100 (including the four corner points discussed further hereinabove in connection with FIG. 8), system 100 determines (for corner point $(t_{r(0)}, C_{I(0)})$) a (c+1)-stage error for all possible combinations of c intermediate points between corner point $(t_{r(0)}, C_{I(0)})$ and corner point $(t_{r(N-1)}, C_{I(N-1)})$. Moreover, for corner point $(t_{r(0)}, C_{I(0)})$, system 100 determines the c intermediate points for which the (c+1)-stage error is smallest. Accordingly, at entry $R_{0,0}$ (of table 950) associated with corner point $t_{r(0)}, C_{I(0)})$, system 100 stores an indication of the c intermediate points for which the (c+1)-stage error is smallest, along with the value of that smallest (c+l)-stage error.

By selecting the c intermediate points as characterization points, system 100 selects $(c+2)^2$ characterization points (including the corner points discussed further hereinabove in connection with FIG. 8). For example, referring FIG. 11, by selecting three intermediate points $t_{r(A)}, C_{I(B)})$ associated with entries 1102, 1202 and 1204, system 100 selects $(3+2)^2=25$ characterization points, namely (a) the three intermediate points($t_{r(A)}, C_{I(B)})$ associated with entries 1102, 1202 and 1204, (b) the four corner points $(t_{r(0)}, C_{I(0)}), (t_{r(0)}, C_{I(N-1)}), (t_{r(N-1)}, C_{I(N-1)})$ and $(t_{r(N-1)}, C_{I(0)})$ associated with entries 1206, 1208, 1210 and 1212, respectively, (c) the side points $(t_{r(A)}, C_{I(B)})$ associated with entries 1214, 1216, 1218, 1220, 1222, 1224, 1226, 1228, 1230, 1232, 1234 and 1236, and (d) the interior points $(t_{r(A)}, C_{I(B)})$ associated with entries 1238, 1240, 1242, 1244, 1246 and 1248.

In an alternative embodiment, system 100 performs the techniques discussed further hereinabove in connection with FIGS. 9, 10 and 11 for two different cases, namely:

(a) a first case in which the candidate points are only points $(t_{r(A)}, C_{I(0)})$ and $(t_{r(A)}, C_{I(N-1)})$, where A is an integer number ranging between 0 and N−1 (i.e. a total of 2*N candidate points), so that aggregately system 100 performs the steps (a) through (d) which are discussed further hereinabove in connection with FIG. 9 a total of Z times, including original and repeated performances, where:

$$Z = (N-1) * \sum_{X=0}^{N-2} [(N-X)-1]; \text{ and}$$

(b) a second case in which the candidate points are only points $(t_{r(0)}, C_{I(B)})$ and $(t_{r(N-1)}, C_{I(B)})$, where B is an integer number ranging between 0 and N−1 (i.e. a total of 2*N candidate points)), so that aggregately system 100 performs the steps (a) through (d) which are discussed further hereinabove in connection with FIG. 9 a total of Z times, including original and repeated performances, where:

$$Z = (N-1) * \sum_{Y=0}^{N-2} [(N-Y)-1].$$

In such an alternative embodiment, where (j*k) is a number of characterization points to be selected by system 100 (including the four corner points discussed further hereinabove in connection with FIG. 8), system 100:

(a) in the first case, determines (for corner point $(t_{r(0)}, C_{I(0)})$) a (j−1)-stage error for all possible combinations of (j−2) intermediate points $(t_{r(0)}, C_{I(0)})$, between corner point $(t_{r(0)}, C_{I(0)})$ and corner point $(t_{r(N-1)}, C_{I(N-1)})$, along with the (j−2) intermediate points for which the (j31 1)-stage error is smallest; and (b) in the second case, determines (for corner point $(t_{r(0)}, C_{I(0)})$) a (k−1)-stage error for all possible combinations of (k−2) intermediate points $(t_{r(0)}, C_{I(W)})$, between corner point $(t_{r(0)}, C_{I(0)})$ and corner point $(t_{r(N-1)}, C_{I(N-1)})$, along with the (k−2) intermediate points for which the (k−1)-stage error is smallest.

Accordingly, at entry $R_{0,0}$ (of table 950) associated with corner point $(t_{r(0)}, C_{I(0)})$, system 100 stores an indication of:

(a) the (j−2) intermediate points for which the (j31 1)-stage error is smallest, along with the value of that smallest (j−1)-stage error; and (a) the (k−2) intermediate points for which the (k−1)-stage error is smallest, along with the value of that smallest (k−1)-stage error.

By selecting the (j−2) intermediate points and the (k−2) intermediate points as characterization points, system 100 selects (j*k) characterization points (including the corner points discussed further hereinabove in connection with FIG. 8). For example, referring FIG. 11, by selecting three intermediate points $(t_{r(A)}, C_{I(0)})$ associated with entries 1232, 1234 and 1236, along with three intermediate points $(t_{r(0)}, C_{I(B)})$ associated with entries 1214, 1216 and 1218, system 100 selects $5^2=25$ characterization points, namely (a) the three intermediate points $(t_{r(A)}, C_{I(0)})$ associated with entries 1232, 1234 and 1236, (b) the three intermediate points $(t_{r(0)}, C_{I(B)})$ associated with entries 1214, 1216 and 1218, (c) the four corner points $(t_{r(0)}, C_{I(0)}), (t_{r(0)}, C_{I(N-1)}), (t_{r(N-1)}, C_{I(N-1)})$ and $(t_{r(N-1)}, C_{I(0)})$ associated with entries 1206, 1208, 1210 and 1212, respectively, (d) the side points $(t_{r(A)}, C_{I(B)})$ associated with entries 1220, 1222, 1224, 1226, 1228 and 1230, and (e) the interior points $(t_{r(A)}, C_{I(B)})$ associated with entries 1102, 1202, 1204, 1238, 1240, 1242, 1244, 1246 and 1248.

Such an alternative embodiment advantageously consumes less time and fewer computer resources, relative to performing the techniques of FIGS. 9, 10 and 11 for $N^2$ candidate points $(t_{r(A)}, C_{I(B)})$ in the illustrative embodiment. However, by selecting the characterization points according to such an alternative embodiment, system 100 might less accurately (in comparison to the illustrative embodiment) determine an estimated value of r (in response to the particular values of $t_r$ and $C_I$ which define point X). By less accurately determining this estimated value of r, system 100 would less accurately execute the static timing analysis software package in response to such estimate, so that system 100 would less accurately analyze timing interrelationships between multiple characterized cells that are coupled to one another within integrated electronic circuitry.

Figure 12:
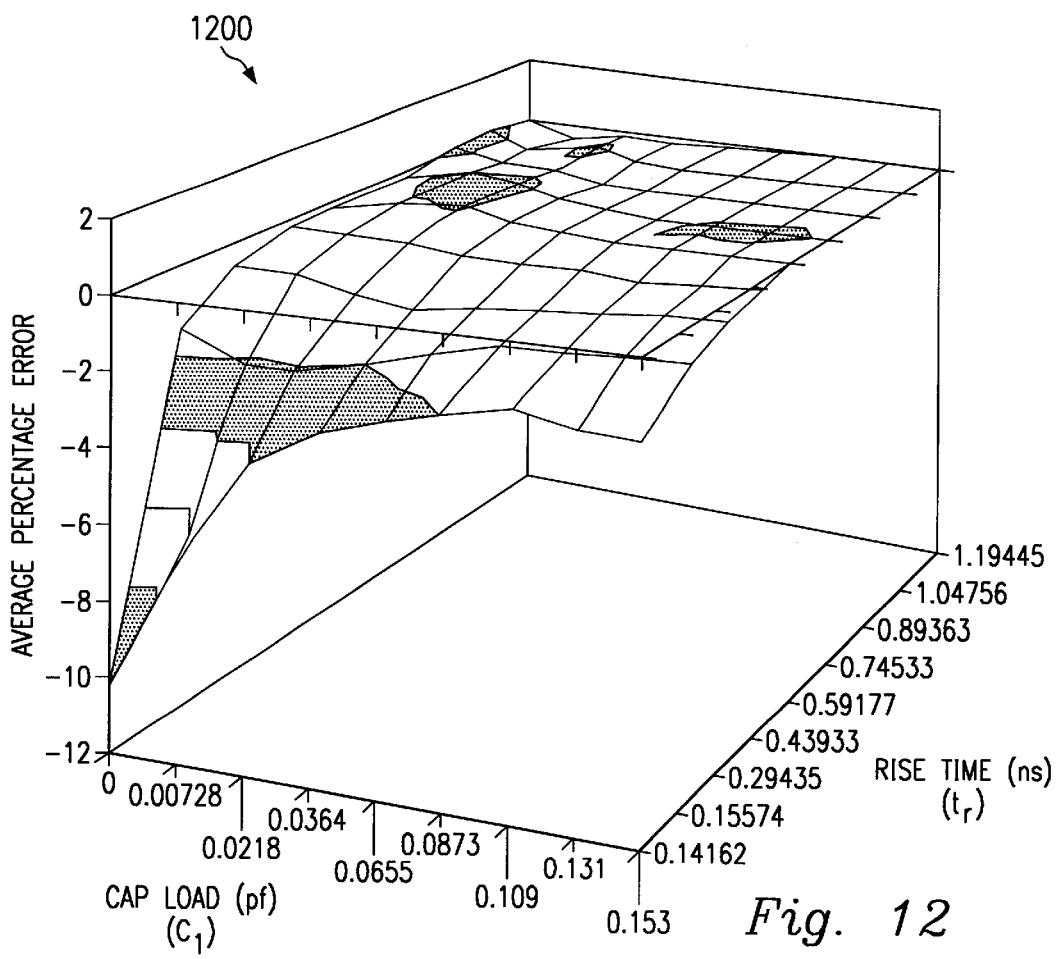
FIG. 12 is a first graph of average percentage error as a function of $C_l$, and $t_r$.

FIG. 12 is a graph, indicated generally at 1200, of average percentage error as a function of $C_I$ and $t_r$, where characterization points were manually selected (after several iterations) by a human without the technique of the illustrative embodiment. In connection with FIG. 12, for each measured point ($t_{r(A)}$, $C_{l(B)}$), system 100:

(a) determined a respective value of r ($r_{interpolate}$) in response to the particular values of $t_r$ and $C_l$ which define such measured point, in accordance with the technique discussed further hereinabove in connection with FIG. 7;

(b) executed SPICE for determining a respective value of r ($r_{SPICE}$) in response to the particular values of $t_r$ and $C_l$ which define such measured point; and (c) determined the percentage error between $r_{interpolate}$ and $r_{SPICE}$.

Such percentage errors are graphically illustrated on graph 1200 as a function of $C_l$ and $t_r$. As shown in FIG. 12, the largest errors occur for smaller values of $C_l$ and $t_r$. This is a shortcoming, because cells in critical timing paths are most likely to have smaller values of $C_l$ and $t_r$.

Figure 13:
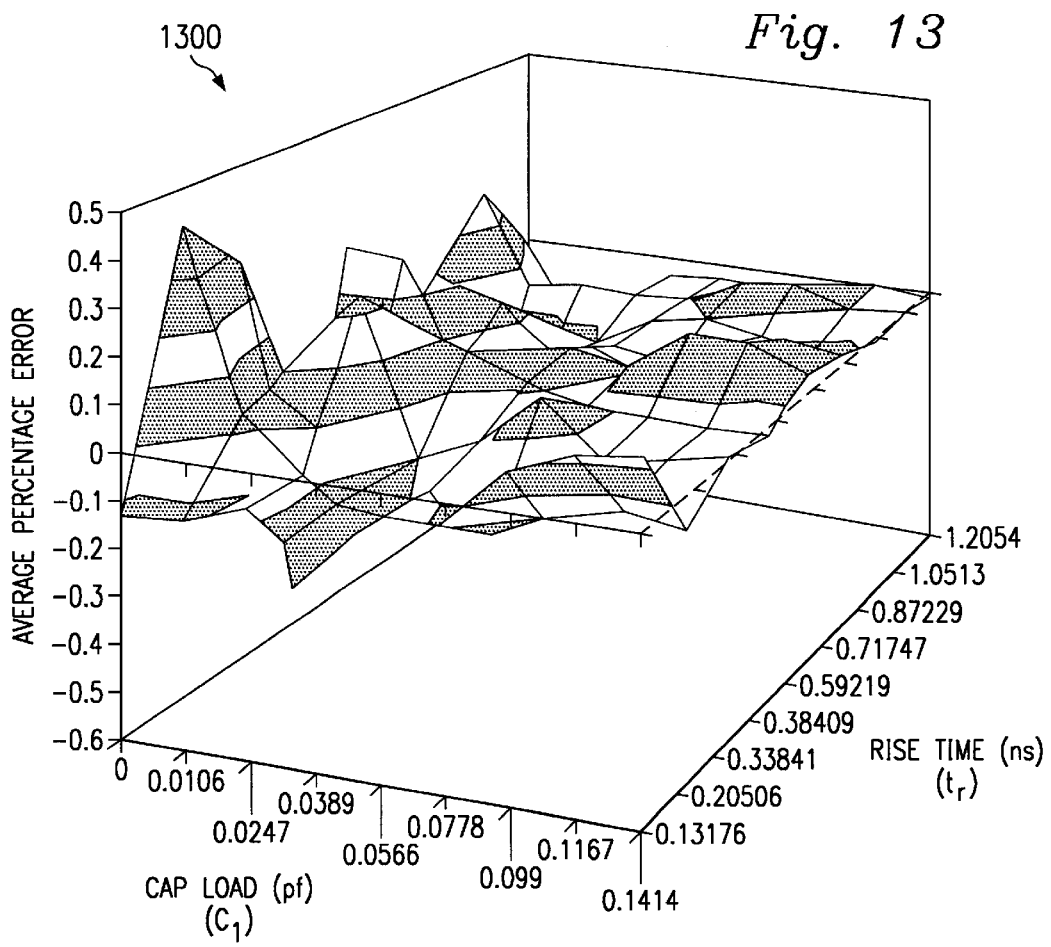
FIG. 13 is a second graph of average percentage error as a function of $C_l$, and $t_r$.

FIG. 13 is a graph, indicated generally at 1300, of average percentage error as a function of $C_l$ and $t_r$, where characterization points were automatically selected by system 100 in accordance with the technique of the illustrative embodiment. In connection with FIG. 13, system 100 determined the percentage errors in the same manner as discussed further hereinabove in connection with FIG. 12. As shown in FIG. 13, the errors are primarily limited to ±0.2%, which is substantially improved over the errors shown in FIG. 12.

In connection with FIG. 13, table 950 (FIG. 9) occupied 3.125 million double-word values, or approximately 25 Mb, of memory within system 100. Within approximately 17 CPU (central processing unit) minutes, system 100 selected c=8 intermediate characterization points between corner point ($t_{r(0)}$, $C_{l(0)}$) and corner point ($t_{r(N-1)}$, $C_{l(N-1)}$). System 100 used approximately 16 of the 17 CPU minutes to perform the steps discussed further hereinabove in connection with FIG. 9. In another example, system 100 selected c=6 intermediate characterization points between corer point ($t_{r(0)}$, $C_{l(0)}$) and corer point ($t_{r(N-1)}$, $C_{l(N-1)}$), within only approximately 9 CPU minutes.

In yet another example, where characterization points were automatically selected by system 100 in accordance with the technique of the alternative embodiment discussed further hereinabove in connection with FIG. 11, the percentage errors were up to three times (3x) higher than errors shown in FIG. 13. Advantageously, however, system 100 selected c=8 intermediate characterization points between corner point ($t_{r(0)}$, $C_{l(0)}$) and corner point ($t_{r(N-1)}$, $C_{l(N-1)}$) within only approximately 5 CPU seconds, and table 950 (FIG. 9) occupied less than 100 Kb of memory within system 100. Moreover, the errors were primarily limited to +0.5% through −0.8%, which is still substantially improved over the errors shown in FIG. 12.

Figure 14:
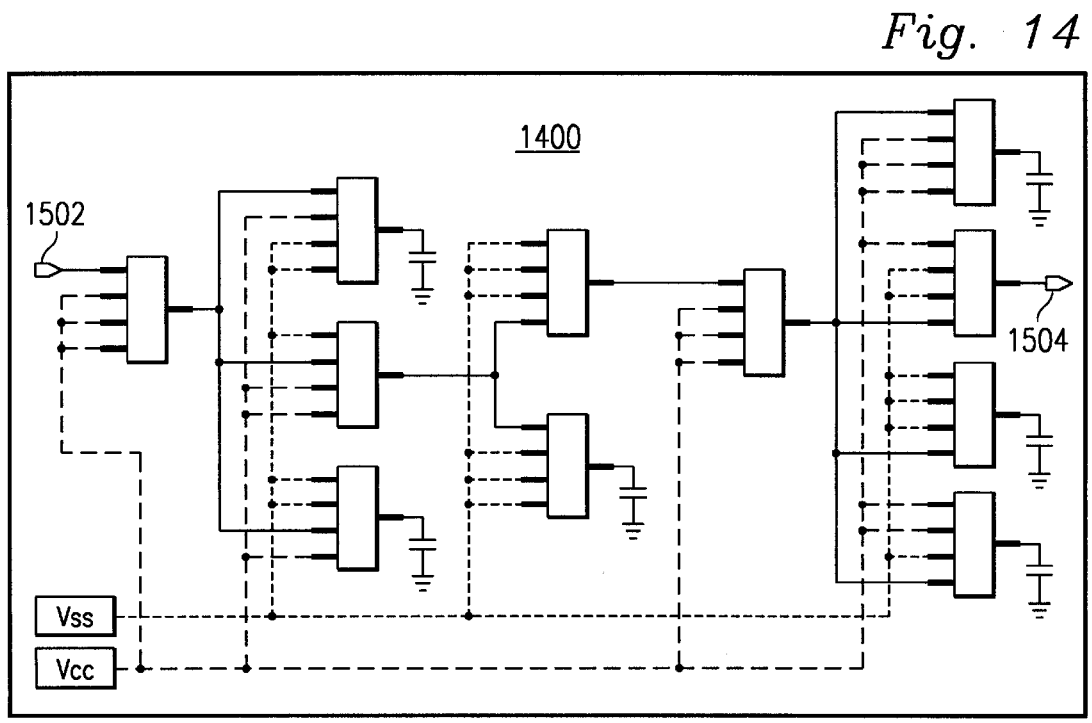
FIG. 14 is a schematic electrical circuit diagram of circuitry, including a biased path, created according to the illustrative embodiment.

FIG. 14 is a schematic electrical circuit diagram of circuitry 1400, including a biased path, created according to the illustrative embodiment. System 100 has characterized a standard cell library in accordance with the technique of the illustrative embodiment. The library included almost 2000 standard cells. With components from the library, system 100 creates (or "synthesizes") a design of circuitry (e.g. circuitry 1400).

For verifying accuracy of the characterization, system 100 executes the Synopsys static timing analysis software package to identify critical timing paths within the design. More particularly, system 100 identifies components along a critical timing path, plus any secondary components. As shown in FIG. 14, according to a technique referred to as tertiary loading, output nodes of secondary components are connected to respective capacitors having capacitive values substantially matched to respective loads driven by such nodes. Also, as shown in FIG. 14, with regard to nodes outside the critical timing path and apart from secondary components, such nodes are biased to $V_{CC}$ or $V_{SS}$ for the purpose of propagating the signal from an input node 1502 to an output node 1504.

After identifying the critical timing path, performing tertiary loading of output nodes of secondary components, and biasing nodes outside the critical timing path and apart from secondary components: system 100 executes SPICE in response to such information, and system 100 measures results therefrom at input nodes and output nodes of cells within the design. Such results are $t_{in}$, $t_{out}$ and $t_d$ as discussed further hereinabove in connection with FIG. 4. System 100 is able to compare such results against measurements from the Synopsys static timing analysis software package (executed by system 100).

System 100 has performed such verification for over 200 different critical timing paths that include cells characterized according to the illustrative embodiment. Over 98% of the paths had cumulative path delays (e.g. cumulative path delay between input node 1502 and output node 1504) with error margins less than 2% to 4%. Accordingly, the static timing delays measured from the Synopsys static timing analysis software package (executed by system 100) were usually 2% to 4% greater than those measured from SPICE (executed by system 100).

In the illustrative embodiment, the characterization technique of system 100 is implemented on a UNIX operating system using a C++ programming language. Also, in the illustrative embodiment, system 100 performs solution of the characteristic equation by LU decomposition and forward and backward substitution. The version of SPICE in the illustrative embodiment is HSPICE, commercially available from Avant! Corporation, having an address at 46871 Bayside Parkway Fremont, Calif. 94538, a telephone number (510) 413-8000, and a facsimile number (510) 413-8080.

Although an illustrative embodiment and its advantages have been described in detail hereinabove, they have been described as example and not as limitation. Various changes, substitutions and alterations can be made in the illustrative embodiment without departing from the breadth, scope and spirit of the claims.

What is claimed is:

1. A system for modeling an operation of circuitry, comprising:

a computer for:

according to a first model of the operation of the circuitry, generating a first set of estimates of the operation of the circuitry in response to a set of circuitry conditions, including generating a first estimate of the operation of the circuitry in response to a first circuitry condition;

according to a second model of the operation of the circuitry, generating a second set of estimates of the operation of the circuitry in response to the first circuitry condition and to the first set of estimates of the operation of the circuitry, wherein the second model of the operation of the circuitry includes a characteristic equation;

in response to a comparison between the first estimate of the operation of the circuitry and the second set of estimates of the operation of the circuitry, selecting a subset of the first set of estimates of the operation of the circuitry; and outputting information representing the selected subset in response to which, according to the second model of the operation of the circuitry, the operation of the circuitry is representable within a circuitry design having a second circuitry condition.

2. The system of claim 1 wherein the first model includes a circuit simulator.

3. The system of claim 1 wherein the second model includes a characterization table that includes the characteristic equation.

4. The system of claim 1 wherein the second model is a static timing analysis model including the characteristic equation.

5. The system of claim 1 wherein the computer is for generating the second set by:

determining respective sets of constant elements of the characteristic equation in response to subsets of the first set; and according to the characteristic equation, in response to the first circuitry condition, generating the second set including respective estimates of the operation in response to the sets of constant elements.

6. The system of claim 5 wherein the computer is for selecting the selected subset from among the subsets of the first set in response to the comparison, the comparison being a comparison between the first estimate and the estimates of the second set.

7. The system of claim 6 wherein:

the subsets of the first set are respectively associated with the sets of constant elements, so the selected subset of the first set is associated with a particular set of constant elements;

the estimates of the second set are respectively associated with the sets of constant elements, so a particular estimate of the second set is associated with the particular set of constant elements; and among the estimates of the second set, the particular estimate is closest to the first estimate.

8. The system of claim 1 wherein the operation is a response time of the circuitry.

9. The system of claim 1 wherein the operation is a propagation delay of the circuitry.

10. The system of claim 1 wherein the circuitry conditions include at least two types of circuitry conditions.

11. The system of claim 1 wherein the circuitry conditions include at least three types of circuitry conditions.

12. The system of claim 1 wherein the circuitry conditions include capacitive loadings of the circuitry.

13. The system of claim 1 wherein the circuitry conditions include input transition times of the circuitry.

14. The system of claim 13 wherein the circuitry conditions include at least two types of input transition times of the circuitry.

15. The system of claim 1 wherein the circuitry is integrated circuitry.

16. A method performed by a computer for modeling an operation of circuitry, the method comprising:

according to a first computer-implemented model of the operation of the circuitry, generating a first set of estimates of the operation of the circuitry in response to a set of circuitry conditions, including generating a first estimate of the operation of the circuitry in response to a first circuitry condition;

according to a second computer-implemented model of the operation of the circuitry, generating a second set of estimates of the operation of the circuitry in response to the first circuitry condition and to the first set of estimates of the operation of the circuitry, the second computer-implemented model of the operation of the circuitry including a characteristic equation;

in response to a comparison between the first estimate of the operation of the circuitry and the second set of estimates of the operation of the circuitry, selecting a subset of the first set of estimates of the operation of the circuitry; and outputting information representing the selected subset in response to which, according to the second computer-implemented model of the operation of the circuitry, the operation of the circuitry is representable within a circuitry design having a second circuitry condition.

17. The method of claim 16 wherein the generating of the first set of estimates comprises:

according to the first computer-implemented model of the operation, generating the first set of estimates of the operation in response to the set of circuitry conditions, the first computer-implemented model including a circuit simulator.

18. The method of claim 16 wherein the generating of the second set of estimates comprises:

according to the second computer-implemented model of the operation, generating the second set of estimates, the second computer-implemented model including a characterization table that includes the characteristic equation.

19. The method of claim 16 wherein the generating of the second set of estimates comprises:

according to the second computer-implemented model of the operation, generating the second set of estimates, the second computer-implemented model being a static timing analysis model including the characteristic equation.

20. The method of claim 16 wherein the generating of the second set of estimates comprises:

determining respective sets of constant elements of the characteristic equation in response to subsets of the first set; and according to the characteristic equation, in response to the first circuitry condition, generating the second set including respective estimates of the operation in response to the sets of constant elements.

21. The method of claim 20 wherein the selecting of the subset comprises:

selecting the selected subset from among the subsets of the first set in response to the comparison, the comparison being a comparison between the first estimate and the estimates of the second set.

22. The method of claim 21 wherein the selecting of the subset comprises:

selecting the selected subset from among the subsets of the first set in response to the comparison, the subsets of the first set being respectively associated with the sets of constant elements, so the selected subset of the first set is associated with a particular set of constant elements;

the estimates of the second set being respectively associated with the sets of constant elements, so a particular estimate of the second set is associated with the particular set of constant elements; and among the estimates of the second set, the particular estimate being closest to the first estimate.

23. The method of claim 16 wherein the generating of the first set of estimates comprises:

according to the first computer-implemented model of the operation, generating the first set of estimates of the operation in response to the set of circuitry conditions, the operation being a response time of the circuitry.

24. The method of claim 16 wherein the generating of the first set of estimates comprises:

according to the first computer-implemented model of the operation, generating the first set of estimates of the operation in response to the set of circuitry conditions, the operation being a propagation delay of the circuitry.

25. The method of claim 16 wherein the generating of the first set of estimates comprises:

according to the first computer-implemented model of the operation, generating the first set of estimates of the operation in response to the set of circuitry conditions, the circuitry conditions including at least two types of circuitry conditions.

26. The method of claim 16 wherein the generating of the first set of estimates comprises:

according to the first computer-implemented model of the operation, generating the first set of estimates of the operation in response to the set of circuitry conditions, the circuitry conditions including at least three types of circuitry conditions.

27. The method of claim 16 wherein the generating of the first set of estimates comprises:

according to the first computer-implemented model of the operation, generating the first set of estimates of the operation in response to the set of circuitry conditions, the circuitry conditions including capacitive loadings of the circuitry.

28. The method of claim 16 wherein the generating of the first set of estimates comprises:

according to the first computer-implemented model of the operation, generating the first set of estimates of the operation in response to the set of circuitry conditions, the circuitry conditions including input transition times of the circuitry.

29. The method of claim 28 wherein the generating of the first set of estimates comprises:

according to the first computer-implemented model of the operation, generating the first set of estimates of the operation in response to the set of circuitry conditions, the circuitry conditions including at least two types of input transition times of the circuitry.

30. The method of claim 16 wherein the generating of the first set of estimates comprises:

according to the first computer-implemented model of the operation, generating the first set of estimates of the operation in response to the set of circuitry conditions, the circuitry being integrated circuitry.

31. A computer program product for modeling an operation of circuitry, the computer program product comprising:

a computer application processable by a computer for causing the computer to:

according to a first model of the operation of the circuitry, generate a first set of estimates of the operation of the circuitry in response to a set of circuitry conditions, including generating a first estimate of the operation of the circuitry in response to a first circuitry condition;

according to a second model of the operation of the circuitry, generate a second set of estimates of the operation of the circuitry in response to the first circuitry condition and to the first set of estimates of the operation of the circuitry, wherein the second model of the operation of the circuitry includes a characteristic equation;

in response to a comparison between the first estimate of the operation of the circuitry and the second set of estimates of the operation of the circuitry, select a subset of the first set of estimates of the operation of the circuitry; and output information representing the selected subset in response to which, according to the second model of the operation of the circuitry, the operation of the circuitry is representable within a circuitry design having a second circuitry condition; and apparatus from which the computer application is accessible by the computer.

32. A computer program product of claim 31 wherein the first model includes a circuit simulator.

33. A computer program product of claim 31 wherein the second model includes a characterization table that includes the characteristic equation.

34. The computer program product of claim 31 wherein the second model is a static timing analysis model including the characteristic equation.

35. The computer program product of claim 31 wherein the computer application is processable by the computer for causing the computer to generate the second set by:

determining respective sets of constant elements of the characteristic equation in response to subsets of the first set; and according to the characteristic equation, in response to the first circuitry condition, generating the second set including respective estimates of the operation in response to the sets of constant elements.

36. The computer program product of claim 35 wherein the computer application is processable by the computer for causing the computer to select the selected subset from among the subsets of the first set in response to the comparison, the comparison being a comparison between the first estimate and the estimates of the second set.

37. The computer program product of claim 36 wherein:

the subsets of the first set are respectively associated with the sets of constant elements, so the selected subset of the first set is associated with a particular set of constant elements;

the estimates of the second set are respectively associated with the sets of constant elements, so a particular estimate of the second set is associated with the particular set of constant elements; and among the estimates of the second set, the particular estimate is closest to the first estimate.

38. The computer program product of claim 31 wherein the operation is a response time of the circuitry.

39. The computer program product of claim 31 wherein the operation is a propagation delay of the circuitry.

40. The computer program product of claim 31 wherein the circuitry conditions include at least two types of circuitry conditions.

41. The computer program product of claim 31 wherein the circuitry conditions include at least three types of circuitry conditions.

42. The computer program product of claim 31 wherein the circuitry conditions include capacitive loadings of the circuitry.

43. The computer program product of claim 31 wherein the circuitry conditions include input transition times of the circuitry.

44. The computer program product of claim 43 wherein the circuitry conditions include at least two types of input transition times of the circuitry.

45. The computer program product of claim 31 wherein the circuitry is integrated circuitry.

46. A system for modeling an operation of circuitry, comprising:
- a computer for:
  - according to a first model of the operation of the circuitry, generating a first set of estimates of the operation of the circuitry in response to a set of circuitry conditions, including generating a first estimate of the operation of the circuitry in response to a first circuitry condition;
  - according to a second model of the operation of the circuitry, generating a second set of estimates of the operation of the circuitry in response to the first circuitry condition and to the first set of estimates of the operation of the circuitry, wherein the second model of the operation of the circuitry includes a characteristic equation;
  - in response to a comparison between the first estimate of the operation of the circuitry and the second set of estimates of the operation of the circuitry, selecting a subset of the first set of estimates of the operation of the circuitry; and
  - in response to information representing the selected subset, according to the second model of the operation of the circuitry, representing the operation of the circuitry within a circuitry design having a second circuitry condition.

47. A method performed by a computer for modeling an operation of circuitry, the method comprising:
- according to a first computer-implemented model of the operation of the circuitry, generating a first set of estimates of the operation of the circuitry in response to a set of circuitry conditions, including generating a first estimate of the operation of the circuitry in response to a first circuitry condition;
- according to a second computer-implemented model of the operation of the circuitry, generating a second set of estimates of the operation of the circuitry in response to the first circuitry condition and to the first set of estimates of the operation of the circuitry, the second computer-implemented model including a characteristic equation;
- in response to a comparison between the first estimate of the operation of the circuitry and the second set of estimates of the operation of the circuitry, selecting a subset of the first set of estimates of the operation of the circuitry; and
- in response to information representing the selected subset, according to the second computer-implemented model of the operation of the circuitry, representing the operation of the circuitry within a circuitry design having a second circuitry condition.

48. A computer program product for modeling an operation of circuitry, the computer program product comprising:
- a computer application processable by a computer for causing the computer to:
  - according to a first model of the operation of the circuitry, generate a first set of estimates of the operation of the circuitry in response to a set of circuitry conditions, including generating a first estimate of the operation of the circuitry in response to a first circuitry condition;
  - according to a second model of the operation of the circuitry, generate a second set of estimates of the operation of the circuitry in response to the first circuitry condition and to the first set of estimates of the operation of the circuitry, wherein the second model of the operation of the circuitry includes a characteristic equation;
  - in response to a comparison between the first estimate of the operation of the circuitry and the second set of estimates of the operation of the circuitry, select a subset of the first set of estimates of the operation of the circuitry; and
  - in response to information representing the selected subset, according to the second model of the operation of the circuitry, represent the operation of the circuitry within a circuitry design having a second circuitry condition; and
- apparatus from which the computer application is accessible by the computer.

* * * * *